(12) United States Patent
Leu et al.

(10) Patent No.: US 7,278,756 B2
(45) Date of Patent: Oct. 9, 2007

(54) LIGHT-EMITTING DIODE AND BACKLIGHT SYSTEM USING THE SAME

(75) Inventors: Charles Leu, Fremont, CA (US); Tai-Cherng Yu, Tu-Cheng (TW); Ga-Lane Chen, Fremont, CA (US)

(73) Assignee: Hon Hai Precision Industry Co., Ltd., Tu-Chung, Taipei Hsien (TW)

( * ) Notice: Subject to any disclaimer, the term of this patent is extended or adjusted under 35 U.S.C. 154(b) by 41 days.

(21) Appl. No.: 10/950,737

(22) Filed: Sep. 27, 2004

(65) Prior Publication Data
US 2005/0117320 A1    Jun. 2, 2005

(30) Foreign Application Priority Data
Nov. 14, 2003    (TW) ................... 92131959

(51) Int. Cl.
  F21V 23/02    (2006.01)
  F21V 9/00     (2006.01)
  F21V 7/04     (2006.01)
  H01J 1/62     (2006.01)
  H01J 63/04    (2006.01)
  H01J 29/24    (2006.01)

(52) U.S. Cl. .................. 362/260; 362/293; 362/612; 362/614; 362/555; 313/502; 313/512; 257/100; 257/E33.061

(58) Field of Classification Search ........ 362/612–614, 362/293, 260, 555; 257/100, E33.061; 313/502, 313/512
See application file for complete search history.

(56) References Cited

U.S. PATENT DOCUMENTS

| 6,340,824 | B1* | 1/2002  | Komoto et al. ........... 257/99 |
| 6,472,765 | B1* | 10/2002 | Sano et al. ............ 257/787 |
| 6,501,091 | B1* | 12/2002 | Bawendi et al. ......... 257/14 |
| 6,613,247 | B1  | 9/2003  | Hohn et al. |
| 6,686,676 | B2* | 2/2004  | McNulty et al. ........ 313/112 |
| 6,707,247 | B2* | 3/2004  | Murano ................. 313/501 |
| 6,747,293 | B2* | 6/2004  | Nitta et al. ............ 257/99 |
| 6,800,996 | B2* | 10/2004 | Nagai et al. ........... 313/512 |
| 6,850,001 | B2* | 2/2005  | Takekuma .............. 313/501 |
| 6,960,878 | B2* | 11/2005 | Sakano et al. ......... 313/512 |
| 7,075,116 | B2* | 7/2006  | Okazaki ................ 257/98 |

(Continued)

FOREIGN PATENT DOCUMENTS

CN    1381906 A    11/2002

(Continued)

*Primary Examiner*—John Anthony Ward
*Assistant Examiner*—David Makiya
(74) *Attorney, Agent, or Firm*—Jeffrey T. Knapp

(57) ABSTRACT

A light-emitting diode (LED) (10) includes a chip body (103), an encapsulation can (105) surrounding the chip body, and a base (106) supporting the encapsulation can and the chip body thereon. Numerous fluorescent particles (1050) are provided in the encapsulation can. With the fluorescent particles, light beams from the chip body are diffused and attain wider irradiation angles. A backlight system (900) includes a light guide plate (20), and a number of the above-described LEDs disposed adjacent to the light guide plate. Light beams having wide irradiation angles are emitted from the LEDs and enter the light guide plate. This enables a light emitting surface of the light guide plate to have highly uniform brightness.

8 Claims, 3 Drawing Sheets

U.S. PATENT DOCUMENTS

| | | |
|---|---|---|
| 2002/0172039 A1 | 11/2002 | Inditsky |
| 2004/0125590 A1* | 7/2004 | Tsai .......................... 362/31 |
| 2005/0035365 A1* | 2/2005 | Sato et al. ................. 257/100 |
| 2005/0052871 A1* | 3/2005 | Leu et al. ................... 362/311 |
| 2005/0200271 A1* | 9/2005 | Juestel et al. ............... 313/503 |
| 2006/0072339 A1* | 4/2006 | Li et al. ..................... 362/608 |

FOREIGN PATENT DOCUMENTS

| | | |
|---|---|---|
| KR | 20030033996 | 5/2003 |
| TW | 554547 A | 9/2003 |
| WO | 03/021691 | 3/2003 |
| WO | WO03/093393 A1 | 11/2003 |

* cited by examiner

LIGHT-EMITTING DIODE AND BACKLIGHT SYSTEM USING THE SAME

CROSS-REFERENCE TO RELATED APPLICATIONS

This application is related to a copending U.S. patent application, namely Applcation No. 10/951,848, entitled "LIGHT-EMITTING DIODE AND BACKLIGHT SYSTEM USING THE SAME", filed on the same day that the present application was filed, and with the same applicant and assignee as those of the present application. The disclosure of the above identified application is incorporated herein by reference.

BACKGROUND OF THE INVENTION

1. Field of the Invention

The present invention relates to a light-emitting diode (LED), and especially to an LED used in a backlight system for a device such as a liquid crystal display.

2. Description of the Prior Art

Liquid crystal displays are commonly used as the display device for compact electronic apparatuses, because they not only display good quality images using little power but also are very thin. However, the liquid crystals in a liquid crystal display do not emit any light themselves. The liquid crystals have to be lit up by a light source so as to clearly and sharply display text and images. Typically, LEDs are used as the light source because of their high luminance and low loss.

Referring to FIG. 5, a conventional LED 1 includes a base 16, a chip body 13 mounted on the base 16, and an encapsulation can 15 sealing the chip body 13. In general, the encapsulation can 15 is made of a transparent or translucent epoxy resin, and a maximum radiation angle of the LED 1 is 120°.

FIG. 6 shows a backlight system 90, comprising three of the LEDs 1 and a light guide plate 2. Light paths within the light guide plate 2 are also shown. Light beams 3 are projected from the LEDs 1 to an incident surface 21 of the light guide plate 2. The light guide plate 2 redirects the light beams, which ten emit from an emitting surface (not labeled) of the light guide plate 2. However, because each of the LEDs 1 emits light beams with a maximum radiation angle of 120°. resulting light beams 3 within the light guide plate 2 yield a plurality of dark areas 23 corresponding to gaps between adjacent LEDs 1. The dark areas 23 prevent the backlight system 90 from providing uniform illumination.

Therefore, it is desired to provide an LED and a backlight system using the same which overcome the above-described disadvantages of the prior art.

SUMMARY OF THE INVENTION

An object of the present invention is to provide an LED which has a large radiation angle.

Another object of the present invention is to provide a backlight system yielding uniform illumination derived from light beams originally emitted from one or more LEDs having large radiation angles.

According to a first aspect of the present invention, there is provided an LED comprising a chip body, an encapsulation can surrounding the chip body, and a base supporting the encapsulation can and the chip body thereon. A plurality of fluorescent particles is contained in the encapsulation can, for scattering light emitted from the chip body. With these diffusing particles, light beams from the chip body are diffused and attain wider radiation angles.

In order to achieve the second objective, there is provided a backlight system comprising a light guide plate, and a plurality of LEDs according to the above-described LED. The LEDs are disposed adjacent to the light guide plate. Light beams having wide radiation angles are emitted from the LEDs and enter the light guide plate. This enables a light emitting surface of the light guide plate to have highly uniform brightness without any dark areas.

Other objects, advantages, and novel features of the present invention will be apparent from the following detailed description of preferred embodiments thereof with reference to the attached drawings.

DETAILED DESCRIPTION OF THE PRESENT INVENTION

Figure 1:
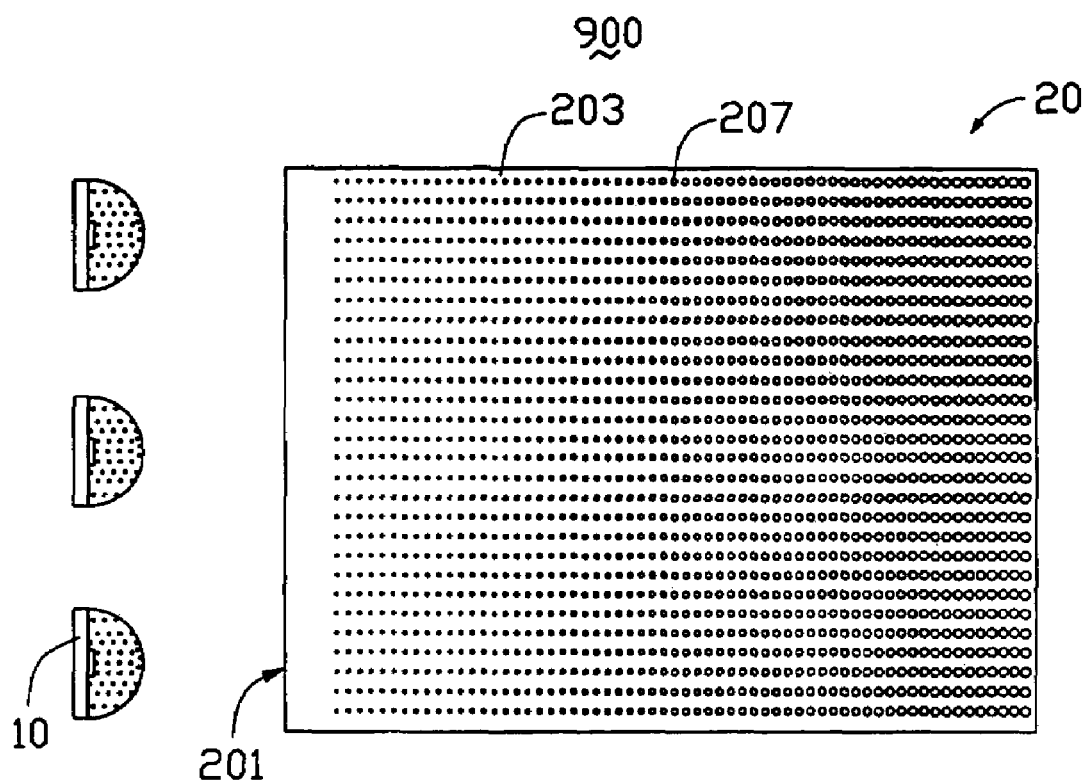
FIG. 1 is a bottom plan view of a backlight system in accordance with a first preferred embodiment of the present invention, the backlight system including three LEDs.

Referring to FIG. 1, a backlight system 900 in accordance with the first preferred embodiment of the present invention includes a plate-like light guide member 20 in this embodiment and a plurality of LEDs 10 as a light source. The LEDs 10 provide light beams to the light guide plate 20, which redirects the light beams. Thus the light guide plate 20 functions to convert a series of point light sources into a uniform surface light source.

The light guide plate 20 is made of transparent material such as acrylic resin, polycarbonate resin, polyvinyl chloride, or glass. The light guide plate 20 is a rectangular sheet, or alternatively may be generally cuneiform. The light guide plate 20 includes a light incident surface 201, an emitting surface (not labeled) connected with the light incident surface 201, and a bottom surface 203 opposite to the emitting surface. The light incident surface 201 of the light guide plate 20 receives light beams from the LEDs 10. The emitting surface of the light guide plate 20 is flat, and the bottom surface 203 of the light guide plate 20 can be formed with a plurality of dots 207. The dots 207 improve the uniformity of illumination of the light guide plate 20. Sizes of the dots 207 become progressively larger with increasing distance away from the light incident surface 201. The dots 207 may for example be hemispherical, cylindrical, cubic, cuboid, or pyramidal. In the illustrated embodiment, hemispherical dots 207 are used. Alternatively, the bottom surface 203 of the light guide plate 20 can be formed with V-cut grooves (not shown) instead of with the dots 207.

Figure 2:
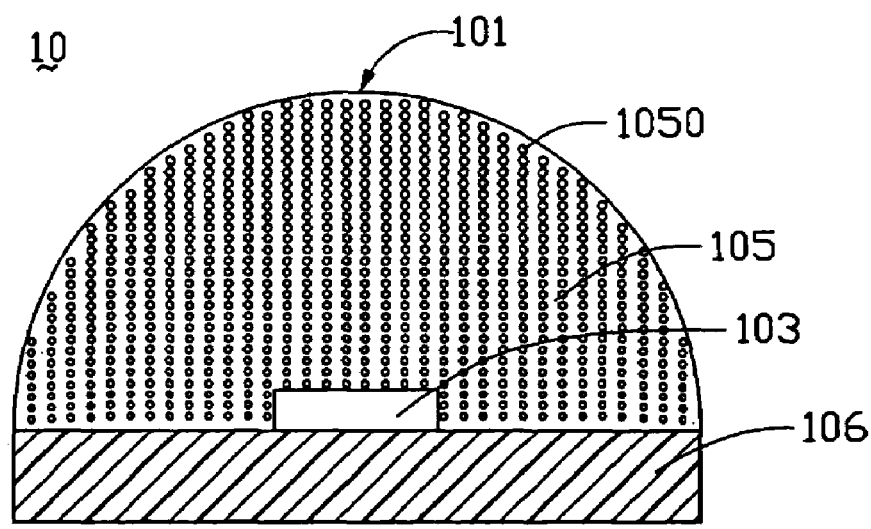
FIG. 2 is an enlarged, schematic cross-sectional view of one LED of the backlight system of FIG. 1.

Referring to FIGS. 1 and 2, the LEDs 10 are positioned adjacent to the light incident surface 201. Each LED 10 includes a base 106, a chip body 103 fixed on the base 106, and an encapsulation can 105 covering the chip body 103 and having a light emitting surface 101. The encapsulation can 105 is filled with numerous fluorescent particles 1050 which scatter light beams emitted from the chip body 103. The fluorescent particles 1050 may be distributed in the encapsulation can 105 uniformly or non-uniformly. In the illustrated embodiment, the fluorescent particles 1050 are distributed in the encapsulation can 105 uniformly. The fluorescent particles 1050 may be spherical, cylindrical, or conical with a circular base. In the illustrated embodiment, spherical fluorescent particles 1050 are employed. The fluorescent particles 1050 are made of a fluorescent material such as Fluorescein Isorhiocyanate (F1TC), Rhodamine B, NileBlue A or alkaline silicate. The fluorescent particles 1050 made of FITC emit green fluorescent light when excited. The fluorescent particles 1050 made of Rhodainine B emit yellow fluorescent light when excited. The fluorescent particles 1050 made of NileBlue A emit red fluorescent light when excited. The fluorescent particles 1050 made of alkaline silicate emit blue fluorescent light when excited. A diameter of each fluorescent particle 1050 is in the range from 1 µm to 10 µm, and the fluorescent particles 1050 progressively decrease slightly in size from a top of the encapsulation can 105 to a bottom of the encapsulation can 105 at the base 106. Because the fluorescent particles 1050 are uniformly distributed in the encapsulation can 105, and because the diameters of the fluorescent particles 2050 are in the range from 1 µm to 10 µm, the light beams emitted from the chip body 103 can be scattered very uniformly.

Figure 3:
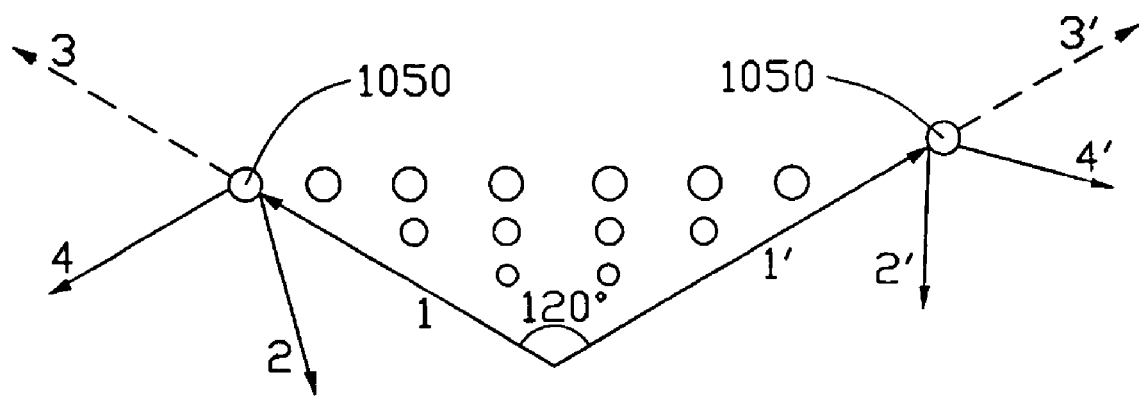
FIG. 3 is an enlarged, essential optical paths diagram showing light beams within a part of an encapsulation can of the LED of FIG. 2.

FIG. 3 shows essential light paths in accordance with the present invention. An included angle between a light beam 1 and a light beam 1' is 120°, which is the maximum included angle. When the light beam 1 (1') meets a fluorescent particle 1050, the light beam 1 (1') is refracted and reflected by the fluorescent particle 1050, and a refracted light beam 4 (4') and reflected light beam 2 (2') are generated. The light beam 1 (1') does not transmit in a through direction 3 (3'). After being refracted and reflected many times by numerous particles 1050, the light beam 1 (1') transmits in various directions other than the through directions 3 (3'). For this reason, the maximum radiation angle between the light beam 1 and the light beam 1' is larger than 120°. The fluorescent particles 1050 function as the equivalent of small light sources, which collectively emit scattered light beams having no particular emitting angle. The light beam 1 (1') and the scattered light beams 4 (4'), 2 (2') and derivatives thereof illuminate the light guide plate 20 with substantially uniform illumination.

The fluorescent particles 1050 not only scatter the light from the chip body 103, but also illuminate green fluorescent light, yellow fluorescent light, red fluorescent light or blue fluorescent light according to the fluorescent material employed. Furthermore, the LED 10 can be configured to emit white emitting light by ensuring that fluorescent particles 1050 made of different fluorescent materials are present in suitable proportions. For example, by ensuring that fluorescent particles 1050 made of Rhodamine B and alkaline silicate are present in suitable proportions, the yellow fluorescent light and the blue fluorescent light produced by these fluorescent particles 1050 cooperate with the fluorescent light produced by the other fluorescent particles 1050 to yield white emitting light. In such case, the luminance of the LED 10 is improved.

Figure 4:
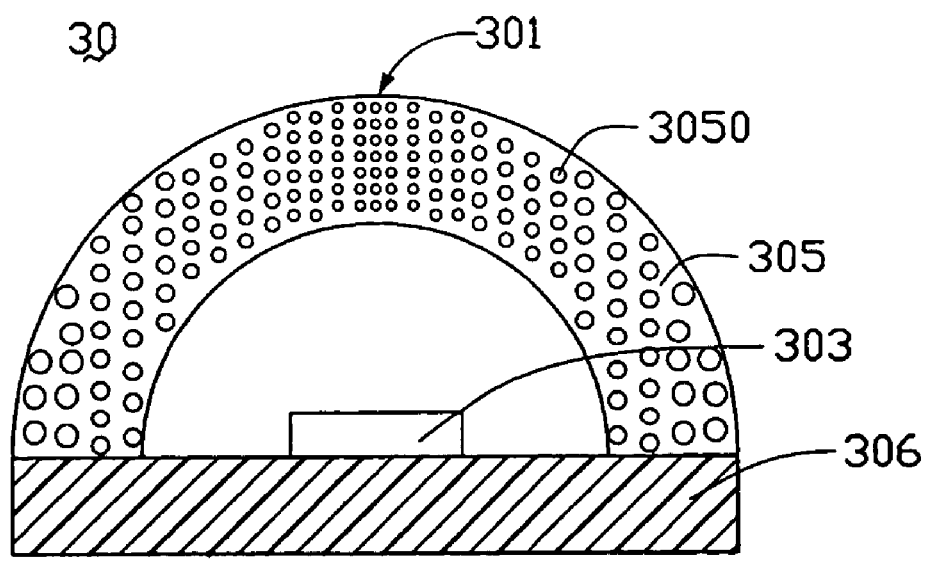
FIG. 4 is an enlarged, schematic cross-sectional view of an LED in accordance with a second preferred embodiment of the present invention.
Figure 5:
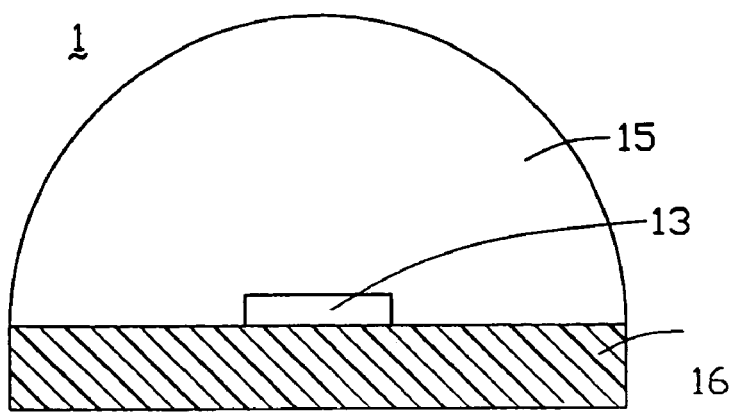
FIG. 5 is a schematic, cross-sectional view of a conventional LED.
Figure 6:
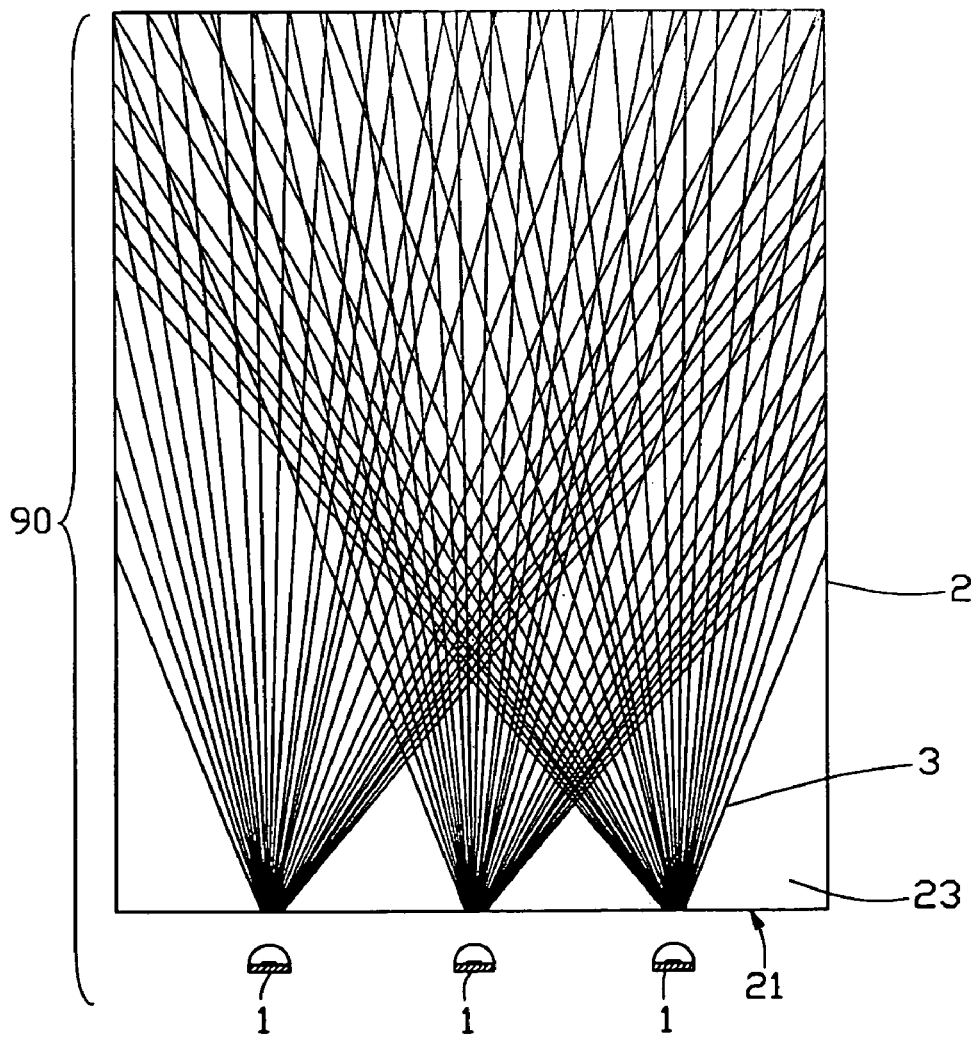
FIG. 6 is a schematic, cross-sectional of a backlight system comprising three of the LEDs of FIG. 5 and a light guide plate, showing light paths within the light guide plate.

FIG. 4 shows an enlarged, schematic cross-sectional view of the LED in accordance with the second preferred embodiment of the present invention. The LED 30 comprises a chip body 303 for emitting light, an encapsulation can 305 surrounding the chip body 303 and having a light emitting surface 301, and a base 306 supporting the encapsulation can 305 and the chip body 303. The encapsulation can 305 has numerous fluorescent particles 3050 arranged therein.

The fluorescent particles 3050 are distributed in a region adjacent to the light emitting surface 301, distal from the chip body 303. The fluorescent particles 3050 progressively increase in size with increasing distance away from a center axis of the region. The fluorescent particles 3050 scatter light emitted from the chip body 303 to improve luminance and uniformity of illumination.

In summary, by filling the fluorescent particles 1050, 3050 in the encapsulation can 105, 305, the light beams emitted from the chip body 103, 303 are refracted and reflected. The light beams, the refracted light beams, the reflected light beams and derivatives thereof enlarge the radiation angle of each LED 10, 30. The fluorescent particles 1050, 3050 function like many small light sources emitting light. This improves the luminance and uniformity of illumination of the backlight system 900.

In further embodiments, the backlight system 900 may, for example, have an antireflective film or a brightness enhancement film coated on the light incident surface 201 by an e-beam evaporation method or a chemical vapor deposition method. Further still, a fluorescence film may be coated on the light incident surface 201 in order to color the light beams incident thereon.

It is to be understood, however, that even though numerous characteristics and advantages of the present invention have been set forth in the foregoing description, together with details of the structure and function of the invention, the disclosure is illustrative only, and changes may be made in detail to the full extent indicated by the broad general meaning of the terms in which the appended claims are expressed.

What is claimed is:

1. A light-emitting diode comprising:
   a base;
   a chip body fixed on the base; and
   a single encapsulation can covering the chip body;
   wherein a plurality of fluorescent particles having diameters in the range from 1 µm to 10 µm is contained in the single encapsulation can for scattering light emitted from the chip body, and the fluorescent particles are distributed in a region of the single encapsulation can distal from the chip body and progressively increase in size with increasing distance along a perpendicular direction away from a vertical, center axis of the region and constant in size in columns parallel to the vertical, center axis.

2. The light-emitting diode as claimed in claim 1, wherein the fluorescent particles comprise items selected from the group consisting of green fluorescent material, red fluorescent material, yellow fluorescent material and blue fluorescent material.

3. The light-emitting diode as claimed in claim 2, wherein the selected items are configured to be in proportions whereby the light-emitting diode emits white light.

4. The light-emitting diode as claimed in claim 2, wherein the green fluorescent material is Fluorescein Isothiocyanate, the red fluorescent material is NileBlue A, the yellow fluorescent material is Rhodamine B, and the blue fluorescent material is alkaline silicate.

5. A backlight system comprising:
- a light guide plate having a light incident surface, a light emitting surface adjacent to the light incident surface, and a bottom surface opposite to the light emitting surface; and
- at least one light-emitting diode having a base, a chip body fixed on the base, and a single encapsulation can covering the chip body;
- wherein a plurality of fluorescent particles having diameters in the range from 1 µm to 10 µm is contained in the single encapsulation can for scattering light emitted from the chip body, and the fluorescent particles are distributed in a region of the single encapsulation can distal from the chip body and progressively increase in size with increasing distance along a perpendicular direction away from a vertical, center axis of the region and constant in size in columns parallel to the vertical, center axis.

6. The backlight system as claimed in claim 5, wherein the fluorescent particles comprise items selected from the group consisting of green fluorescent material, red fluorescent material, yellow fluorescent material and blue fluorescent material.

7. The backlight system as claimed in claim 6, wherein the selected items are configured to be in proportions whereby said light-emitting diode emits white light.

8. The backlight system as claimed in claim 6, wherein the green fluorescent material is Fluorescein Isothiocyanate, the red fluorescent material is NileBlue A, the yellow fluorescent material is Rhodamine B, and the blue fluorescent material is alkaline silicate.

* * * * *